(12) United States Patent
Barnett

(10) Patent No.: US 6,756,560 B2
(45) Date of Patent: *Jun. 29, 2004

(54) PLASMA ENHANCED CIRCUIT COMPONENT ATTACH METHOD AND DEVICE

(75) Inventor: Ronald J. Barnett, Santa Rosa, CA (US)

(73) Assignee: Geomat Insights, L.L.C., Santa Rosa, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/996,035

(22) Filed: Nov. 19, 2001

(65) Prior Publication Data

US 2003/0094442 A1 May 22, 2003

(51) Int. Cl.$^7$ ............................................... B23K 10/00
(52) U.S. Cl. ............................. 219/121.46; 219/121.45
(58) Field of Search ...................... 219/121.46, 121.45, 219/121.54, 121.59, 121.37, 121.52, 121.58; 156/272.2, 244.17, 244.22, 244.23, 244.24, 282, 273.9, 275.5, 275.7

(56) References Cited

U.S. PATENT DOCUMENTS

| 5,421,953 A | * | 6/1995 | Nagakubo et al. | ............. 216/34 |
| 5,831,238 A | * | 11/1998 | Takuya et al. | .......... 219/121.59 |
| 6,221,197 B1 | * | 4/2001 | Mori et al. | .............. 156/308.6 |
| 6,521,857 B1 | * | 2/2003 | Barnett | ................... 219/121.46 |

* cited by examiner

Primary Examiner—Quang T. Van
(74) Attorney, Agent, or Firm—Jessica Costa

(57) ABSTRACT

A method and apparatus for bonding a circuit component to a circuit package or board is presented. A pressurized directional flow of plasma is applied between attachment sites of the component to be bonded and the corresponding bond pad of the package/board. During the application of plasma between the bonding surfaces, direct contact fusion/diffusion bonds the component attachment sites to the corresponding bond pads.

8 Claims, 10 Drawing Sheets

PLASMA ENHANCED CIRCUIT COMPONENT ATTACH METHOD AND DEVICE

CROSS-REFERENCE TO RELATED APPLICATIONS

This application is related to copending applications as follows: U.S. Pat. No. 6,521,857, entitled PLASMA ENHANCED BONDING METHOD AND DEVICE, filed Nov. 19, 2001, U.S. application Ser. No. 09/966,038, entitled PLASMA ENHANCED CIRCUIT PACKAGING METHOD AND DEVICE, filed Nov. 19, 2001, U.S. Pat. No. 6,521,858, entitled PLASMA ENHANCED METAL PLATE BONDING METHOD AND DEVICE, filed Nov. 19, 2001, and U.S. Pat. No. 6,320,155, entitled PLASMA ENHANCED WIRE BONDER, filed Nov. 20, 2001.

FIELD OF THE INVENTION

The present invention pertains generally to circuit fabrication, and more particularly, to a method and apparatus for using hot plasma gas to simultaneously heat, clean, and activate the bonding surfaces before and during bonding of circuit components to a circuit board.

BACKGROUND OF THE INVENTION

Various techniques exist for bonding metals together, including welding, brazing, soldering, and more recently, direct contact and diffusion bonding.

Welding is a metal joining process wherein coalescence is produced by heating the metal to suitable temperatures, with or without the application of pressure and with or without the use of filler metals. Coalescence is a growing together into one body. A weld is the junction of members or the edges of members which are to be joined or have been joined by melting and refreezing at the contact interfaces of members themselves. Filler metal is the material to be added in making a welded, brazed, or soldered joint. Base metal is the material to be welded, soldered, or cut.

The term arc welding applies to a large and varied group of processes that use an electric arc as the source of heat to melt and join metals together as the molten metal re-freezes. In arc welding processes, the joining of metals, or weld, is produced by the extreme heat of an electric arc drawn between an electrode and the work-piece, or between two electrodes. The formation of a joint between metals being arc welded may or may not require the use of pressure or filler metal. The arc is struck between the workpiece and an electrode that is mechanically or manually moved along the joint, or that remains stationary while the workpiece is moved underneath it. The electrode is either a consumable wire rod or a nonconsumable carbon or tungsten rod which carries the current and sustains the electric arc between its tip and the workpiece. When a nonconsumable electrode is used, a separate rod or wire can supply filler material, if needed. A consumable electrode is specially prepared so that it not only conducts the current and sustains the arc, but also melts and supplies filler metal to the joint, and may produce a slag covering as well.

Gas welding processes are a group of welding processes in which a weld is made by heating with a gas flame. Pressure and/or filler metal may or may not be used. Also referred to as oxyfuel gas welding, the term gas welding is used to describe any welding process that uses a fuel gas combined with oxygen, or in rare cases, with air (20% Oxygen), to produce a flame having sufficient energy to melt the base metal. The fuel gas and oxygen are mixed in the proper proportions in a chamber, which is generally a part of the welding tip assembly. The torch is designed to give the welder complete control of the welding flare, allowing the welder to regulate the melting of the base metal and the filler metal. The molten metal from the work-piece edges and the filler metal intermix in a common molten pool and join upon cooling to form one continuous piece.

Brazing and soldering are welding processes in which materials are joined by heating to a suitable temperature and by using a filler metal with a melting point below that of the base metal. The filler metal is distributed to the closely fitted surfaces of the joint by capillary action.

Resistance welding consists of a group of processes in which the heat for welding is generated by the resistance to the electrical current flow through the parts being joined, using pressure. It is commonly used to weld two overlapping sheets or plates which may have different thicknesses. A pair of low resistance electrodes conducts electrical current through the sheets, forming a weld. The Key aspect of the resistance weld is that most of the resistance in the welding circuit is in the contact resistance where the metals are pressed together, so that most of the (I^2*R) heat is formed at the surfaces that are to be welded together.

The properties of a welded joint depend partly on the correct preparation of the edges being welded. Cleanliness is of key concern. All mill scale, rust, oxides, and other impurities must be removed from the joint edges or surfaces to prevent their inclusion in the weld metal. The edges should be prepared to permit fusion without excessive melting. Care must be taken to keep heat loss due to radiation into the base metal from the weld to a minimum. A properly prepared joint will keep both expansion on heating and contraction on cooling to a minimum.

Diffusion bonding is a method of joining metallic or non-metallic materials. This bonding technique is based on the atomic diffusion of elements at the joining interface. Diffusion process actually is the transport of mass in form of atom movement or diffusion through the lattice of a crystalline solid. Diffusion of atoms proceeds by many mechanisms, such as exchange of places between adjacent atoms, motion of interstitial atoms or motion of vacancies in a crystalline lattice structure. The latest is the preferable mechanism due to low activation energy required for atom movement. Vacancy is referred to an unoccupied site in a lattice structure. Both Diffusion and Direct contact bonding are the preferable bonding methods. Direct Contact/Fusion bonding occurs when the surface atoms are brought within atomic distances with the application of pressure and heat. Any surface contamination will inhibit bonding.

Diffusion bonding involves diffusion of atoms via a thermodynamic process where temperature and diffusibility of the material are considerable parameters. In general, the diffusion rate, in term of diffusion coefficient D, is defined as $D = D_o^{-Q/RT}$, where $D_o$ is the frequency factor depending on the type of lattice and the oscillation frequency of the diffusing atom. Q is the activation energy, R is the gas constant and T is the temperature in Kelvin.

The activation energy for atomic diffusion at the surface, interface and grain boundaries is relatively low compared to the bulk diffusion due to a looser bond of the atoms and higher oscillation frequency of the diffusing atom. This enhances the atomic diffusion, and thus eases the diffusion bonding of two metal pieces assuming that a perfect interface contact exists.

Since diffusion bonding is driven by the diffusion of atoms, diffusion bonding process can be used to bond dissimilar materials that are difficult to weld, such as, steel and copper alloys. When bonding metals together, direct contact/fusion and diffusion bonding causes microdeformation of surface features, due to the pressure and temperature applied, which leads to sufficient contact on an atomic scale to cause the materials to bond. However, before the materials can be joined they undergo an extensive preparatory treatment.

The interface contact can be optimized by a treatment of the surface to be bonded through a number of processes, such as mechanical machining and polishing, etching, cleaning, coating, and material creeping under high temperature and loading.

All of the above-mentioned bonding methods are problematic due to the inability to prevent contaminants from adhering to the bond site surfaces. Surface contamination causes poor bond adhesion, resulting in less robust bonds and therefore less reliable interfaces. Accordingly, much effort has gone into cleansing the surfaces of metals prior to being bonded.

Low temperature plasmas of various ionized gases can be used to reactively etch/ash organic materials found on the surface of materials. In this procedure, typically the material is placed in an RF cavity with a flowing reactive gas. The nature of the gas selected is chosen based upon the desired effect. Oxygen or argon is generally used, however, specific gases ($CF_4$) may be used to tailor the reaction for the desired effect. By removing surface contamination, plasma cleaning increases the bonding or adhesive properties of the bondsite surface.

A plasma is a collection of positive, negative, and neutral particles wherein typically the density of the negatively charged particles is equal to the density of the positively charged particles. When an energetic electron strikes a neutral gas molecule, it can cause dissociation and form free radicals and ions. The free radicals cause chemical reactions for destroying contaminants. For example, with oxygen, the dissociation process produces the free radical atomic oxygen (O). This reactive species has enough energy to break a carbon-carbon bond. When the plasma gas is a mixture of hydrogen and argon, for example, the free radical atomic oxygen (O) can therefore combine with the hydrogen ($H_2$) into water ($H_2O$).

Prior art plasma cleaning involves placing the workpieces to be bonded into a plasma chamber, creating a vacuum within the chamber by pumping out all the air from the chamber, introducing a gas or gaseous mixture into the chamber, and energizing the gas in the chamber to produce the plasma. In the presence of the plasma, organic contaminants on the bondsite surfaces are converted to carbon monoxide, carbon dioxide, water vapor, and/or other gasses, which are pulled out of the plasma chamber by a vacuum pump. After a predetermined amount of time, the gas flow and energy are shut off, and the chamber is then purged with a nonreactive gas, such as nitrogen, to remove all traces of volatile compounds. Finally, the chamber is returned to atmospheric pressure. A cleaning cycle usually lasts from between 30 seconds to 15 minutes or more and is largely a function of the workpiece loading in the plasma chamber.

The current plasma cleaning methodology is problematic. First, immediately upon emerging from the plasma cleaning chamber, the cleaned workpiece(s) are re-exposed to surface contamination due to the organic particles in the air. In addition, the separate plasma cleaning chamber and equipment, coupled with the significant amount of time required to set up and execute the cleaning process, is quite costly.

It is therefore an object of the invention to provide a method for simultaneously heating, cleaning, and bonding materials together.

SUMMARY OF THE INVENTION

The present invention is a novel plasma enhanced circuit component attachment method and apparatus. The invention effectively generates a plasma bath, or "bubble", around the attachment sites of a circuit component to be attached and the corresponding circuit board bond sites prior to and during the bonding action to thereby simultaneously heat, clean, and activate the surfaces of the materials that are to be bonded together, while the bonding is taking place.

In accordance with the invention, a circuit component with one or more attachment sites is attached to a circuit board at designated bond sites, or "pads", on the circuit board. The component is positioned over the circuit board such that its attachment sites are aligned with their corresponding bond pads on the circuit board. Prior to bonding each respective attachment site of a component to its corresponding bond pad on the package base/circuit board, hot plasma is applied in a pressurized directional modulated flow between and around the attachment site and bond pad. While continuing to apply the modulated plasma flow, the component attachment site is brought into contact with its associated bond pad on the circuit board. In a preferred embodiment, a press applies pressure on the component attachment site against the bond pad in order to diffusion bond the component attachment site material to the bond pad material. The plasma flow and pressure are then removed, resulting in an enhanced attachment bond between the component and package base/circuit board bond pad.

Preferably, the plasma cleans and activates the surface while heating the bonding surfaces to allow direct contact bonding to take place as the clean metal surfaces are pressed together sufficiently that the surface atoms are brought within atomic distances of each other, and without melting the bonding surfaces. This eliminates the need for an additional heating mechanism for heating the bonding surfaces, thereby preventing component de-soldering or damage to the component or surrounding circuitry from overheating.

Accordingly, the present invention advantageously provides a novel technique that cleans the metal surfaces to be bonded as they are bonded to eliminate any contaminants from being introduced into the final bond, thereby improving the bond adhesion properties. The invention not only allows differing metals to be bonded together, but may also allow materials to be bonded together that prior to the present invention were difficult to bond due to contaminant compounds formed at the bond site, which resulted in weaker bonds. In addition to the above-named advantages, the temperature of the plasma/hot gas is high enough that the press need not include a heater. The invention essentially provides "localized" heating directed only at the bonding surfaces, thereby reducing the risk of damage to the circuitry to be enclosed as well as any surrounding circuitry. The invention also makes possible the bonding of non-metallic materials such as sapphire, silicon, ceramic, and quartz materials in a similar manner. The direct contact bonding method only requires that the surface finish, temperature, and pressure are adequate for enough of the contact surface to be brought close enough together for the atoms from one surface to bond the atoms in the opposite surface while a modulated stream of intense plasma cleans, heats, and activates those surfaces as the contact happens.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A method and apparatus for plasma enhanced circuit component attach that supports the simultaneous heating, cleaning, and bond activation of the bonding surfaces of the circuit component attachment sites and their corresponding bond pads on the package base/circuit board is achieved by maintaining the entire bond site in a dynamic plasma cleaning chamber bubble is described in detail hereinafter. Although the invention is described using certain preferred bonding materials, gaseous plasmas, circuit component attachment site configurations, and bonding apparatus configurations, it is to be understood that other bonding materials and gasses having similar characteristics and other component attach and bonding apparatus configurations that achieve the same results are intended to be covered by the claims appended hereto.

Figure 8:
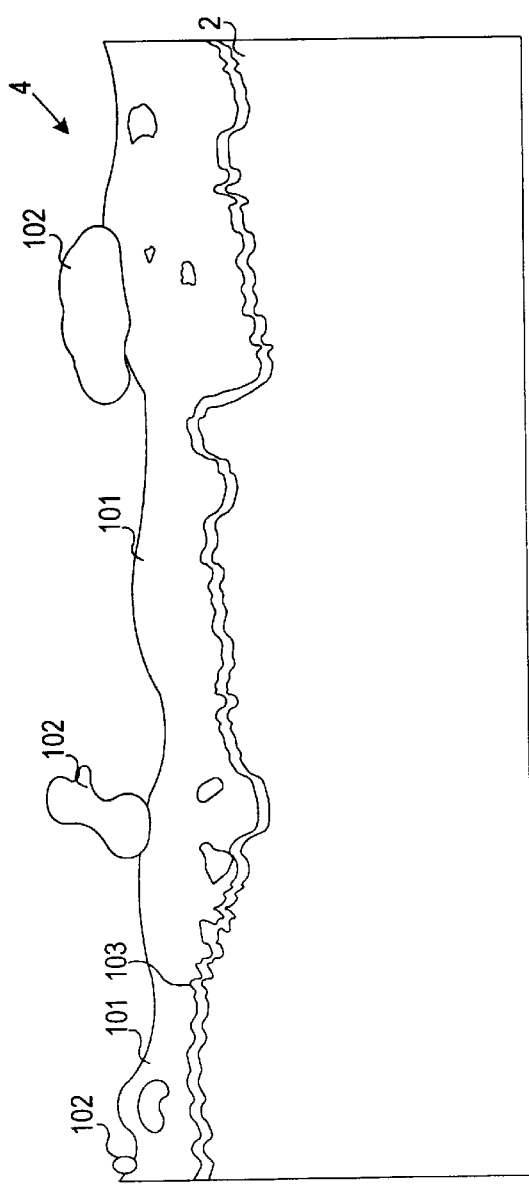
FIG. 8 is a cross-sectional side view of a contaminated member to be bonded shown at the molecular level.
Figure 9:
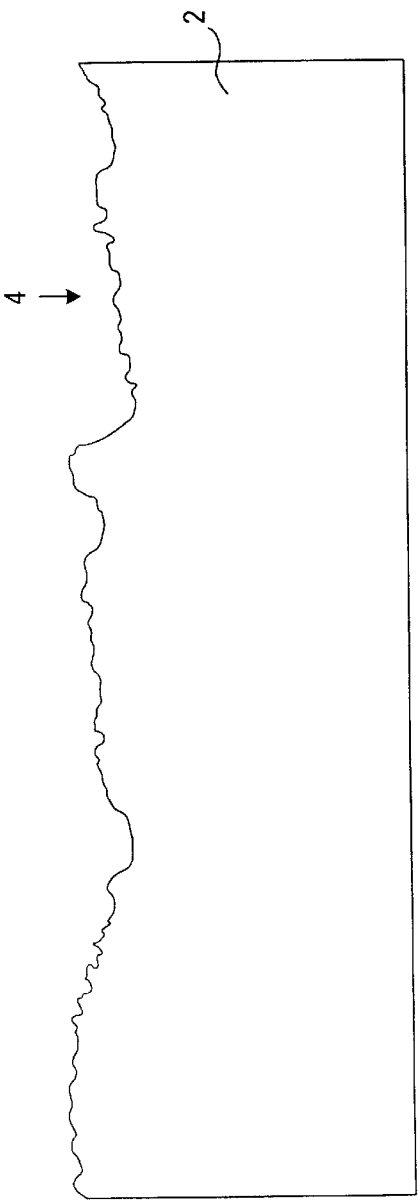
FIG. 9 is a cross-sectional side view of the member of FIG. 8 after plasma cleaning has occurred.
Figure 10:
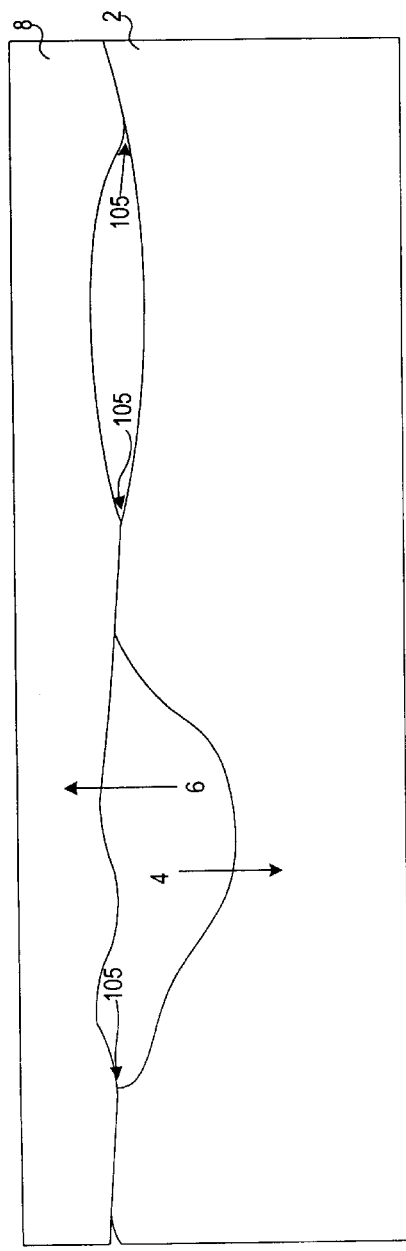
FIG. 10 is a cross-sectional side view of the cleaned member of FIG. 9 after direct contact bonding with another plasma cleaned member has occurred.
Figure 11:
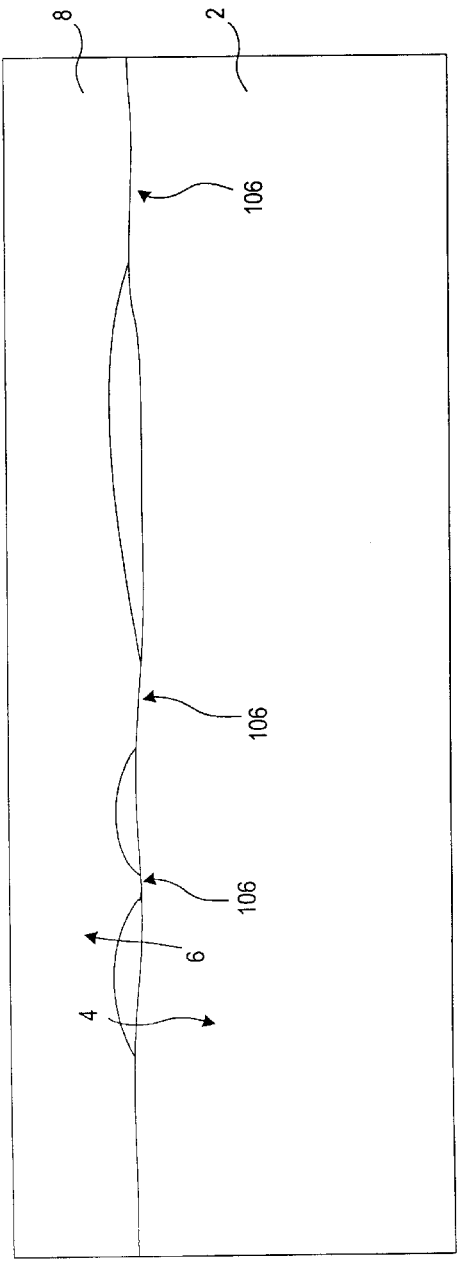
FIG. 11 is a cross-sectional side view of the direct contact bonded member of FIG. 10 after some diffusion has occurred.
Figure 12:
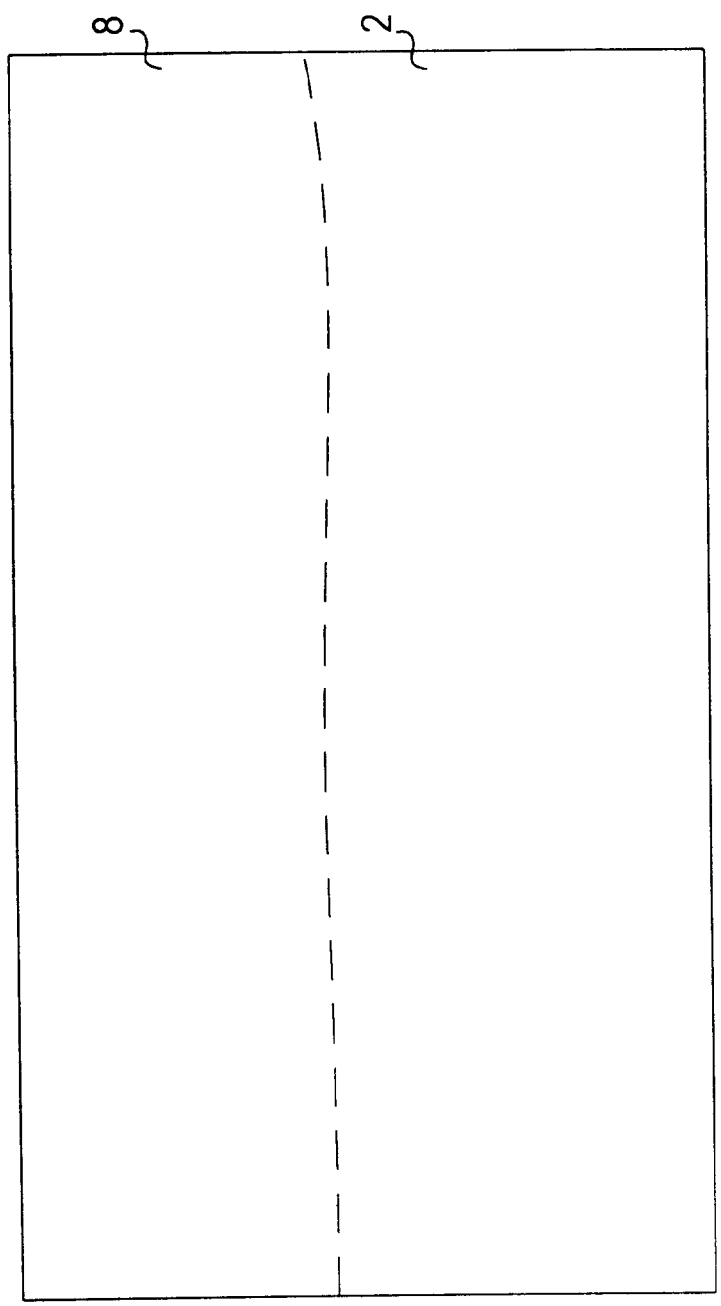
FIG. 12 is a cross-sectional side view of the members of FIG. 11 after full diffusion bonding has occurred.

FIGS. 8–12 illustrate the principles effected by the invention. FIG. 8 is a cross-sectional side view of a portion of a contaminated member 2 (e.g., aluminum) to be bonded shown at the molecular level. As illustrated, at the molecular level, the surface 4 of the member is not smooth, but rather comprises a rough contour with surface variation on the order of 1000 nm. The variation at the surface finish is on the order of 200 nm. Surface 4 is contaminated by various contaminants, for example organic liquid such as machining oil, solid contaminants such as silica dust or epoxy, and oxides. After plasma cleaning, all of organic and inorganic contaminants are removed, as illustrated in FIG. 9. Once cleaned, direct contact bonding may occur with another cleaned member, 8, as illustrated in FIG. 10. As shown, the surfaces 4 and 6 of the members 2 and 8 form direct contact bonds where the surfaces meet when compressed. Diffusion of the molecules near the surfaces 4 and 6 occur after additional time, pressure, and heating, as illustrated in FIG. 11. After sufficient time, pressure, and heating, full diffusion takes place, as illustrated in FIG. 12, to result in a perfect lattice structure.

Figure 1:
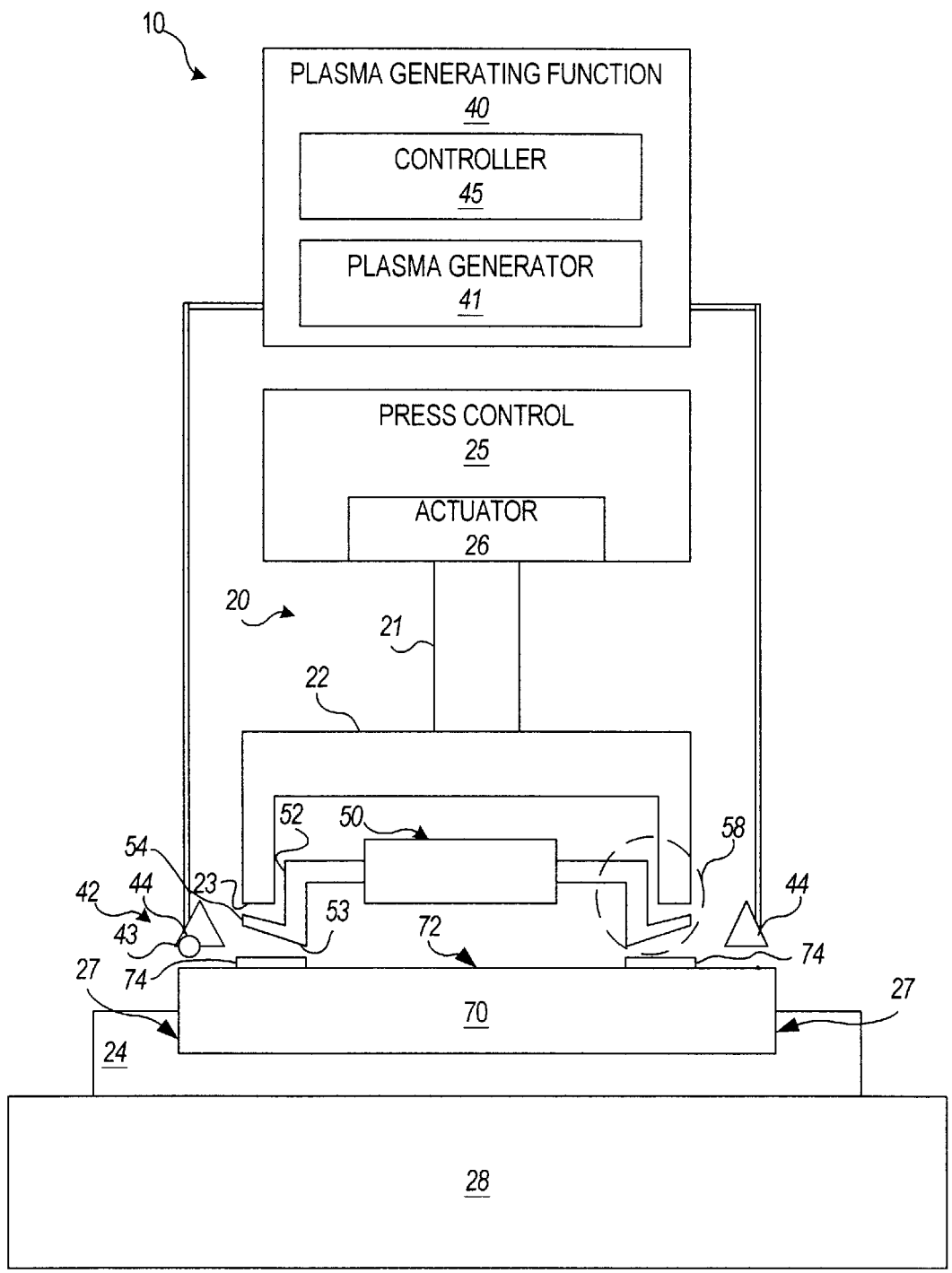
FIG. 1 is a block diagram of a plasma enhanced component attach bonder implemented in accordance with the invention.

Turning now to FIG. 1, there is shown a side view of a plasma enhanced circuit packaging bonder 10 implemented in accordance with the invention. Plasma enhanced circuit packaging bonder 10 includes a component contact function 20 and plasma generator function 40. Depending on the particular application, plasma enhanced component attache bonder 10 may be heaterless for reasons described hereinafter. Plasma enhanced component attach bonder 10 operates to bond attachment sites of circuit components to bond pads of circuit packages or circuit boards. Preferably, component attach function 20 includes a base 28 which supports a platen 24 fixedly positioned thereon. A circuit board 70 having circuitry 72 mounted thereon may be securely positioned on the platen 24 such that any horizontal or vertical movement of the circuit board 70 is prevented. Secure positioning may be accomplished using techniques known in the art such as form-fitting grooves 27 in the upper surface of the platen 24, as shown, which substantially match the length and width dimensions of the circuit board, or alternatively by using guides (not shown) fixedly attached to the upper surface of the platen 24 and located to provide a secure fit of the board 70 within the guides. Alternatively a vacuum chuck can be used under the circuit board/package base, where it is held down by low pressure supplied from an array of holes in platen 24.

Circuit board 70 preferably comprises one or more exposed bond pads 74 on a surface plane 72 of the circuit board 70. One or more circuit components 50 each having one or more component attachment sites 54 are positioned in close proximity to, and preferably with their respective attachment sites in alignment with their corresponding bond pads on the circuit package/circuit board, without actual surface contact between the attachment sites and bond pads. In the illustrative embodiment of FIG. 1, component attachment site of component 50 forms a cross-sectional z-shape as indicated at 58.

FIG. 1 illustrates a plasma enhanced component attach bonder 10 in which the application may provide diffusion bonding of the component attachment site with its corresponding bond pad 74. As described previously, diffusion bonding requires pressure and heat over time.

In the illustrative embodiment, component contact function 20 comprises a hydraulic press 25; however, the principles of the invention equally apply to any type of mechanism that provides sufficient contact pressure between the component attachment site 54 and corresponding circuit board bond pad 74 to allow direct contact bonding to occur. Where the application calls for diffusion bonding, for example applications that require especially strong bonds, the component contact function 20 preferably comprises a press which exerts sufficient force on the attachment sites 54 of the component 50 such that diffusion bonding occurs between the component attachment site 54 and corresponding circuit board bond pad 74.

A multitude of different types of presses are well-known in the art and are intended to be included within the scope of the plasma enhanced component attach bonder 10. In the illustrative embodiment, component contact function 20 includes a press controller 25 which controls an actuator 26 coupled directly or indirectly to a press armature 21 in a manner known in the art. Press armature 21 is coupled to a press foot 22. Press foot 22 comprises a tip 23 against which all contact force is applied. When the press 25 is actuated, the press armature 21 and foot 22 together operate to compress the tip 23 against one side of the component attachment site 54, which in turn compresses the opposite side of the component attachment site 54 against the bond pad 74.

Figure 2A:
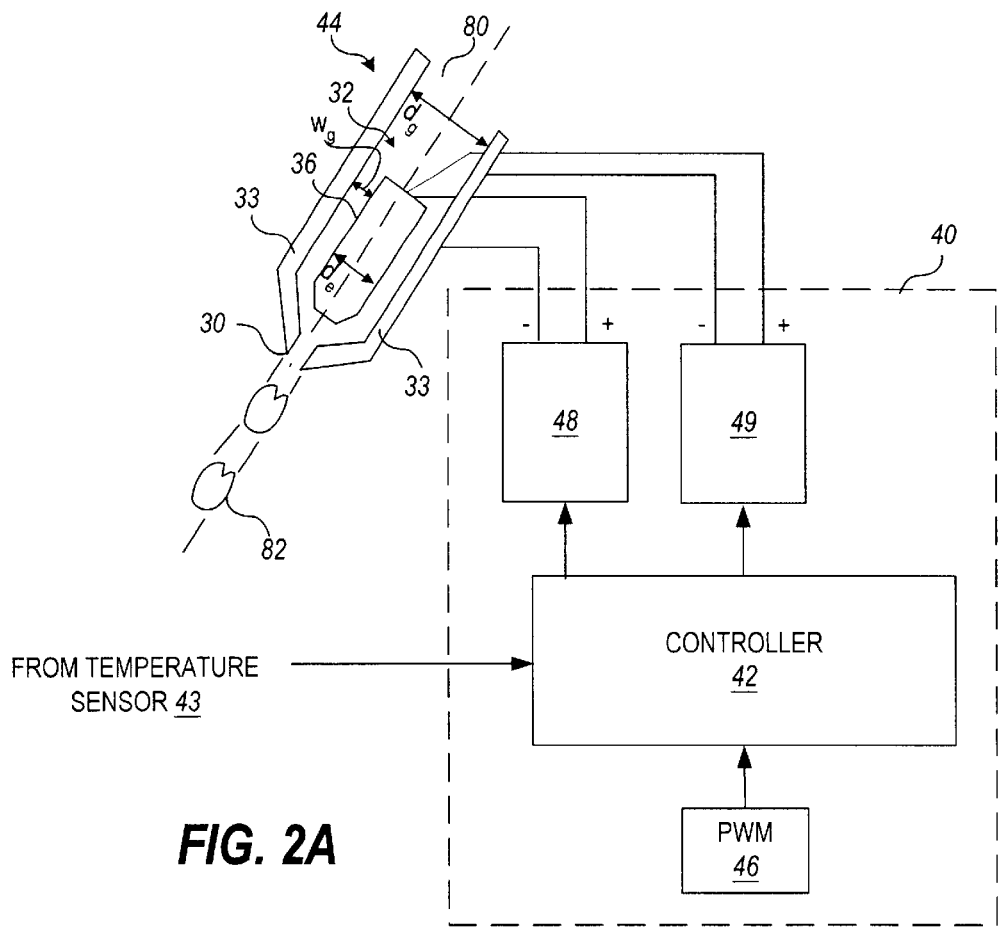
FIG. 2A is a side cross-sectional view of a preferred embodiment of the plasma gun used in the metal bonder of the invention.
Figure 2B:
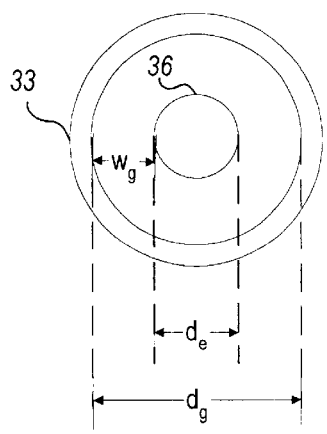
FIG. 2B is a concentric cross-sectional view of the preferred embodiment plasma gun of FIG. 2A.
Figure 3:
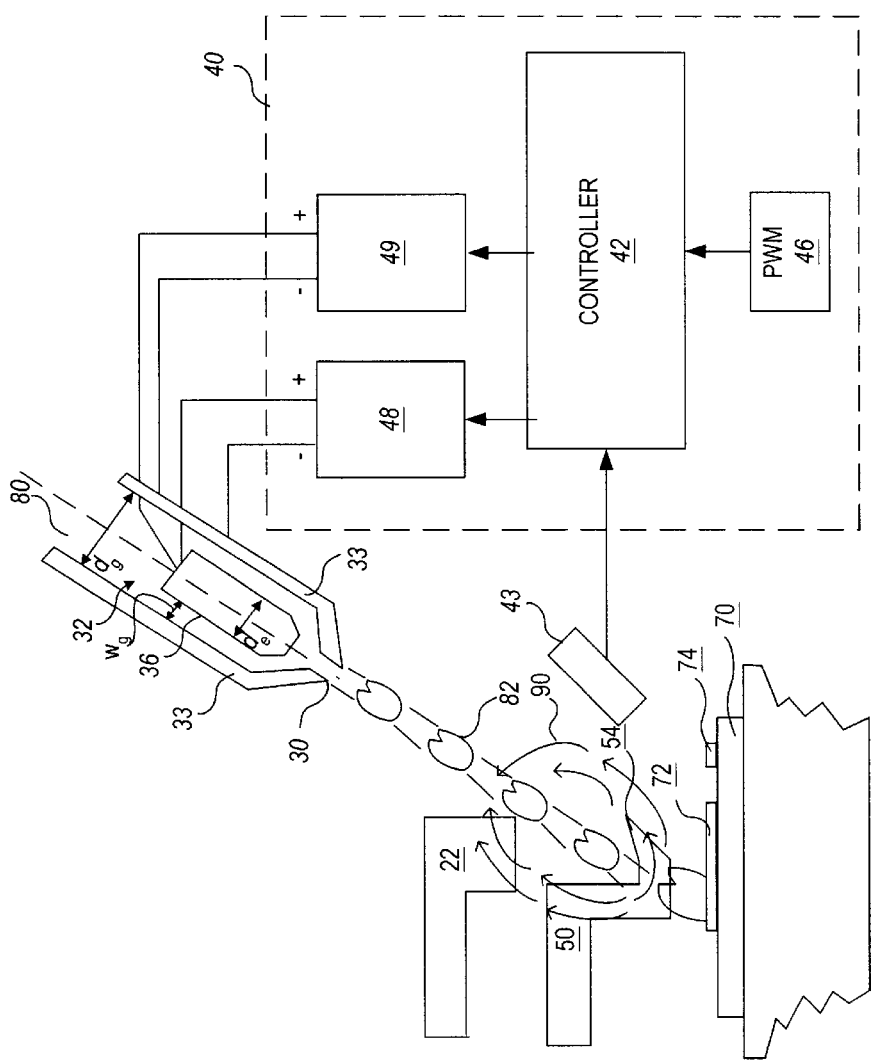
FIG. 3 is a perspective view of a metal bonder implemented in accordance with the invention illustrating the formation of a dynamic cleaning chamber bubble around the bond site.

Plasma generating function 40 includes a plasma generator 41, a plasma output device 42, a temperature sensor 43, and a controller 45. In one embodiment, plasma output device 42 comprises a plurality of plasma guns 44 arranged in a linear array around the peripheral edges of the press foot 22. The array 42 may be attached to the press foot itself, or attached independently of the press. In another embodiment, plasma output device 42 comprises a single plasma gun 44 aimed between the press tip 23 and the bond pad 74. Preferably, each plasma gun 44, as shown in FIGS. 2A and 2B, comprises a hollow coaxial bore 32 through which a steady stream of gas is supplied by a gas supply 46. In the preferred embodiment, gas 80 is a noble gas such as argon, which may optionally be a gaseous mixture such as 95% argon with 5% oxygen or hydrogen. Gas 80 is output from the plasma guns 44 between the bonding surfaces as hereinafter described, forming a dynamic plasma cleaning chamber bubble around the bonding site, as illustrated in FIG. 3. Gas 80 is pulse stimulated by an energizing circuit 48, which ionizes the gas to form hot plasma 82. Bore 32 is shaped aerodynamically to shoot a laminar stream of the hot plasma through a tip 30 at the end opposite of the plasma gun 44 in a directional pressurized flow toward the bonding site. The ions of the hot plasma recombine across the distance between the plasma gun tip 30 and the bonding site to form hot gas. The recombination is optional and is desirable merely to ensure that charge build-up does not occur on the surface of the device being bonded. The effect of the plasma and the hot reactant gasses (such as $H_2$ or $O_2$) is that the bonding surfaces (i.e., the bonding edges 53 of the component attachment site 54 and bond pad 74) are simultaneously heated and cleaned immediately before and during the bonding step as described in more detail hereinafter.

In the preferred embodiment, gas 80 flows continuously through the bore 32 of the plasma gun 44 at the end of the coaxial bore opposite that of the tip 30 under the control of the plasma generator 40. Gas 80 is energized by energizing circuit 48 to form plasma 82. Energizing circuit 48 generates the energy to create the plasma, and is preferably generated either by a direct current voltage or by radio frequency in the range of 1 KHz to 100 GHz.

In the illustrative embodiment, energizing circuit 48 is implemented using a high voltage DC circuit 38 that sparks the initial ionization of the argon gas 80 within the plasma gun 44. A secondary low voltage DC circuit 40 continues the ionization of the gas once the initial ionization spark begins. The ionization of the gas 80 occurs periodically to form a periodic output stream of hot pulses (or "bullets") 82 of plasma. The temperature of the bond site is monitored using a temperature sensor 43 such as an infrared detector. Temperature sensor 43 is coupled to controller 45 which uses the data received from the sensor 43 to maintain the temperature at the desired level. Preferably, the temperature is high enough to allow direct contact fusion/diffusion bonding to take place to thereby eliminate the need for a heater as part of the bonding device (press). In the preferred embodiment, this temperature level is approximately three-quarters of the melting temperature of the base metals, but in any case it is lower than the melting temperature of the circuit component attach sites and bond pads that are to be bonded together.

Figure 4:
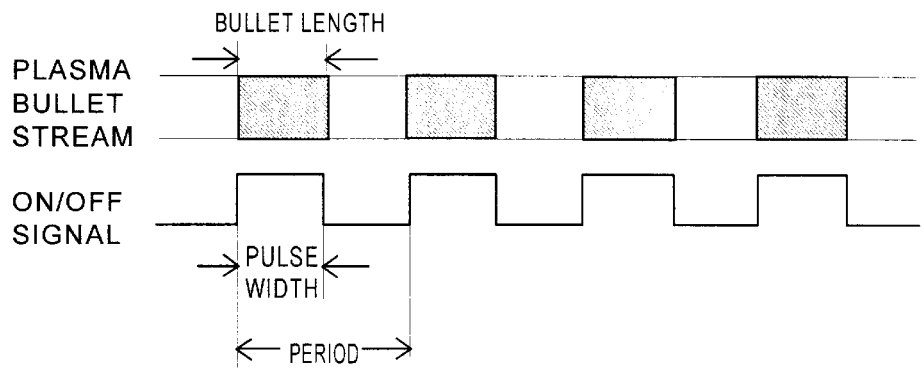
FIG. 4 is a graph illustrating the relationship between the frequency and duty cycle of the energizing circuit and the frequency and length of the plasma bullets.

The plasma bullets 84 are formed in the preferred embodiment by turning on and off the energizing circuit 48. The repetition rate and length of the plasma bullets 82 are controlled via controller 42, which preferably uses a pulse width modulator 46 to control the duty cycle of the energizing circuit 48 to maintain a peak energy that is high enough to guarantee heating and cleansing of the bonding surfaces. In the preferred embodiment, the frequency and length of plasma bullets 82 in the plasma stream is adjusted by design to fit the application. FIG. 4 is a graph illustrating the relationship between the frequency and duty cycle of the ON/OFF signal that controls the energizing circuit 48 and the frequency and length of the plasma bullets 82. As shown, the length of the plasma bullet is proportional to the width of the ON/OFF pulse in the on position. The frequency of the plasma bullets 82 is directly related to the period of the ON/OFF signal.

It will be appreciated by those skilled in the art that in an embodiment where the plasma output device 42 is aimed at the bonding site—namely the bottom surface 53 of the component attachment site 54 and bond pad 74, the plasma bath, and therefore the cleaning and thermal heating, occurs only at the site of the surfaces to be bonded. This prevents damage to, and eliminates unnecessary cleaning of, the rest of the circuitry. The gaseous stream of argon acts as a dynamic cleaning chamber 90 or "bubble" around the bond site, as illustrated in FIG. 3, and once the surfaces 53 of the component attachment site and corresponding bond pad 74 are cleaned, the plasma stream remains until the bonding is complete so that the outward flowing pressure from the gaseous bubble forces air out of the area of the bubble chamber 90 and prevents air from re-entering the area enclosed within the bubble 90. Accordingly, the bonding surfaces 53 and 74 do not become recontaminated during the actual bonding. In operation, when the hot plasma bullets come in contact with the surfaces to be bonded, they perform cleaning by performing one or more of the following actions, including vaporization, reduction, or oxidation, depending on the type of metals to be bonded and the gas or gaseous mixture chosen for the application.

When the gas or gaseous mixture contains a noble gas, such as argon, the noble gas molecules do not easily recombine with molecules containing other elements. Thus, when the noble gas molecules are heated to a high enough energy, the noble gas molecules operate only to break the bonds between surface contaminant molecules and the bond site molecules. This is due to the force of the hot (and therefore high speed) noble gas molecules when colliding with the surface contaminant molecules, which cause the surface contaminant molecules to break away from the bond site surface into free air. This operation is termed herein "vaporization".

When the gas or gaseous mixture contains a more recombinant gas, such as hydrogen ($H_2$), the recombinant gas molecules easily recombine with surface contaminant molecules. Thus, when the recombinant gas combines with surface contaminant molecules, the surface contaminants are converted, or reduced, to another form. For example, if the gas is a mixture of argon and hydrogen, and the surface contaminants are silicon dioxide ($SiO_2$), the hydrogen combines with the oxygen molecules to form water ($H_2O$) and oxygen, thereby reducing the surface contaminants to pure silicon (Si). This process is termed herein "reduction". The remaining surface contaminants can be vaporized by the noble argon gas molecules in the gaseous mixture as described above.

When the gas or gaseous mixture contains oxygen ($O_2$), the oxygen can combine with the surface contaminant molecules to "oxidize" or essentially "burn" away any contaminants present on the surfaces such as aluminum oxide.

In addition to cleaning, the plasma that forms the bubble chamber around the bond site simultaneously activates the bonds of the metal surfaces of the bond site so that surface atoms of both the component attachment site 54 and bond pad 74 on the circuit board 70 are activated to allow the same or different metals to more easily fuse together. In particular, the hot gas breaks the surface bonds of each of the respective bonding surfaces so that they are ready to rebond with the molecules of the other surface.

It will be appreciated that this novel technique of simultaneously cleaning the surfaces, activating the bonds of the surface atoms, and preventing contaminants from recontaminating the bonding surfaces during the bonding process allows metals that heretofore could not be bonded together to be bonded.

Figure 5:
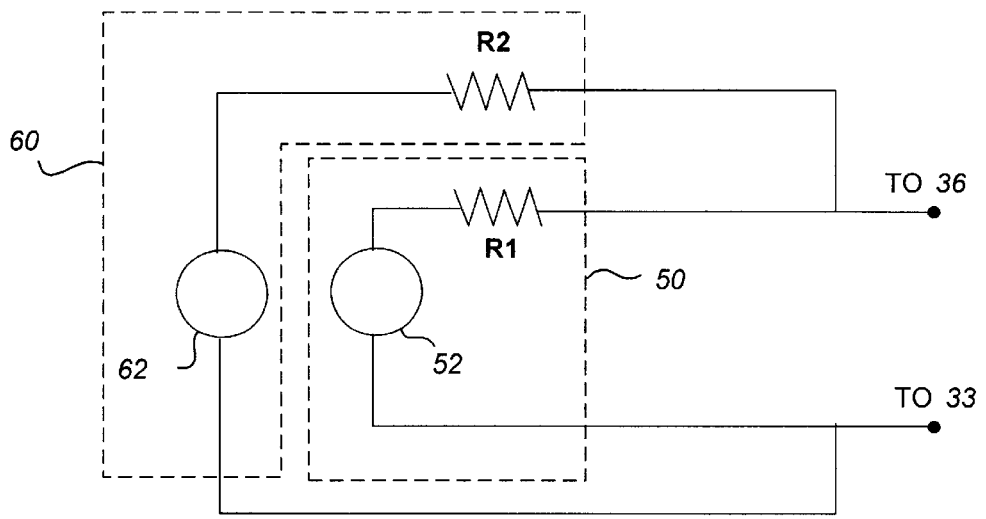
FIG. 5 is a schematic diagram of an illustrative embodiment of a plasma energizing circuit used in the metal bonder of the invention.

FIG. 5 is a schematic diagram of an illustrative embodiment of the circuits 48 and 49 that serve to ionize the argon to form hot plasma. In the illustrative embodiment, energizing circuits 48 and 89 use direct current techniques to energize the gas, and includes an ionization initiation circuit 50 and a high-current circuit 60. Ionization circuit 50 is a high impedance/high voltage power supply which is schematically represented with a DC power supply 52 and a resistor R1. Referring back to FIGS. 2A and 2B, central electrode 36 has a diameter $d_e$ which is a predetermined length less than the diameter $d_g$ of the inner coaxial hollow bore 32. Electrode 36 is arranged coaxially within hollow bore 32, such that a hollow gap $w_g$ is formed concentrically and of even width around the electrode 36 along the coaxial axis. Gap width $w_g$ is defined by $d_g-d_e$, preferably at every point around the coaxial axis.

Referring back to FIG. 5, ionization circuit 50 is a high-voltage, low-current-limited series circuit, which yields high potential across the argon stream flowing through the hollow bore 32 between the electrode 36 and plasma gun walls 33. The design of the ionization is such that it delivers a high enough electric potential across the argon gap $w_g$ to result in ionization of the argon atoms as they pass through the gap. It will be appreciated by those skilled in the art that although ionization is achieved using a high-voltage, low-current-limited circuit, the temperature of the argon gas flowing out the tip 30 of the plasma gun and onto the surface of the bond site is still relatively low due to the limited power delivered to the gas across the gap $w_g$.

Accordingly, high-current circuit 60 is provided to maintain sufficient heat so as to allow the argon atoms to clean the surfaces of the bond site. In the illustrative embodiment, high-current circuit 60 is coupled in parallel with ionization circuit 50, and comprises a DC power supply 62 with a source impedance R2 (<<R1) between central electrode 36 and the outer wall 33 of plasma gun 44. High-current circuit 60 is a low-voltage power source which yields high power across the gap $w_g$ in which the argon stream flows through the hollow bore 32 between the electrode 36 and plasma gun walls 33. The high-current circuit 60 delivers lower voltage across the gap due to the drop in impedance of the ionized gas. This second power supply circuit 60 delivers the bulk of the energy to the gas.

As an illustrative example, if power supply 52 is a 20 KV DC supply initiates ionization and R1 is 1 MOhm (which limits the current to 20 mA). The resistance of the argon across the gap is large before ionization. However, now that the plasma has been ionized the lower voltage high current power supply can be initiated to supply the energy to create the working plasma. This ignition process is similar to using a low power flint spark to fire up a high energy output gas torch. Accordingly, the design of the high-current circuit 60 may be such that power supply 62 is an adjustable supply of approximately 5 to 40 V DC and R1 is near zero Ohms (which allows high output current limited only the voltage supplied and the plasma resistance itself to Vapplied/Plasma Resistance). If the resistance across the gap is 2 ohms, and the power supply voltage is set to 20 volts then the plasma arc current is I=20/2, I=10 amps, then the power delivered across gap $w_g$ is $P=I^2*R=(10 \text{ A})^2 * 2 \text{ Ohms}=200$ W, which is enough power to raise the temperature of the gas atoms to a level sufficient to perform surface cleaning and bonding. In actual practice the power delivered to the plasma will be set for each package and lid to obtain the optimum sealing bond w/o damaging the sealing metals or the surrounding circuitry. Once this peak power is set the final bonding temperature is set, as mentioned earlier, by monitoring the surfaces to be bonded with an IR temperature sensor between the "plasma bullets" and feeding this temperature back to the controller which adjust the pulse width modulator to maintain the optimum bonding surface temperature.

A critical factor in successful plasma cleaning is the choice of a process gas. If the correct gas is chosen, optimum contaminant removal is achieved, and the potential for undesirable substrate oxidation is minimized. Although the invention has been described using argon gas or an argon/oxygen mixture, other suitable gasses or gaseous mixtures may also be employed. Some other exemplary gases, such as hydrogen $H_2$ or carbon tetra-fluoride $CF_4$, possess desirable characteristics for plasma cleaning. Gas selection may vary according to cleaning requirements for a specific substrate, bonding metals, contaminant, application, or process.

Figure 6:
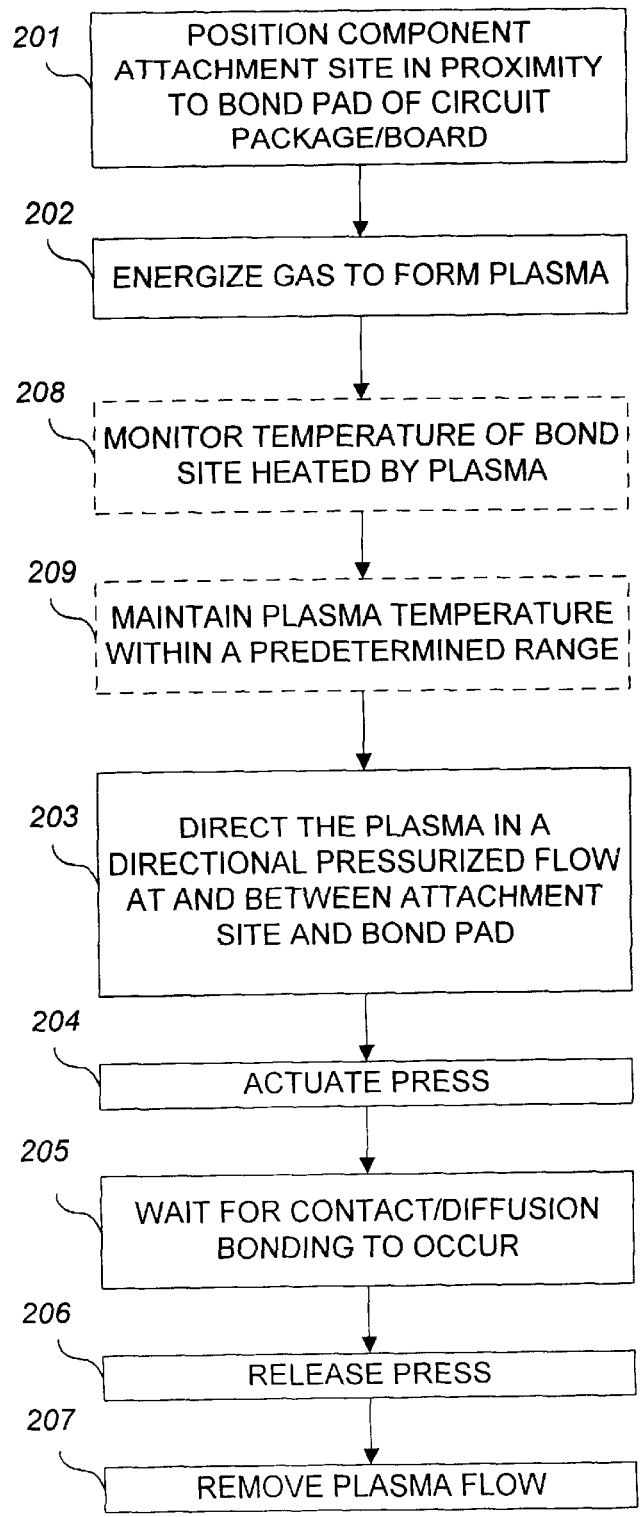
FIG. 6 is an operational flowchart of a method for simultaneously cleaning and bonding wires to bond sites implemented in accordance with the invention.

FIG. 6 is an operational flowchart of a method in accordance with the invention for simultaneously cleaning and bonding circuit component attachment sites to bond pads of electronic packages/circuit boards. In accordance with the method of the invention, the component attachment site 54 of a circuit component 50 is placed in proximity to the bond pad 74 on a circuit package/board to which the component 50 will be bonded (step 201). In the preferred embodiment, this positioning comprises vertically aligning the component attachment site 54 and the corresponding bond pad 74 on the circuit package/board 70. A gas is energized (step 202) to form a plasma. The plasma is directed (step 203) in a directional pressurized modulated flow between the bond surface 53 of the component attachment site 54 and the bond pad 74 of the circuit package/board 70, which forms a plasma cleaning chamber bubble 90 around and between the surface 53 of the component attachment site 54 and the bond pad 74 on the circuit board 70. The component attachment site 54 of the component 50 is brought into surface contact (step 204) with the bond pad 74. In an application that requires diffusion bonding, a press foot is actuated to compress the component attachment site against the bond pad 74 for sufficient time and with sufficient heat (preferably supplied by the temperature of the plasma) to allow diffusion bonding to occur. Once bonding has occurred (step 205) contact pressure is released (step 206) and the plasma stream is removed (step 207). The result is an improved bond between the component attachment site 54 of the circuit component 50 and the bond pad 74 of the circuit package/board 70. Preferably, the temperature of the bond sites heated by the plasma/hot gas is set to a predetermined temperature (e.g., a temperature between 150° C. and 400° C.) and is monitored (step 208) and maintained (step 209) within a predetermined range (e.g., + or −10° C. of the predetermined temperature) so as not to melt or damage the bonding metals, component, or surrounding circuitry.

Figure 7A:
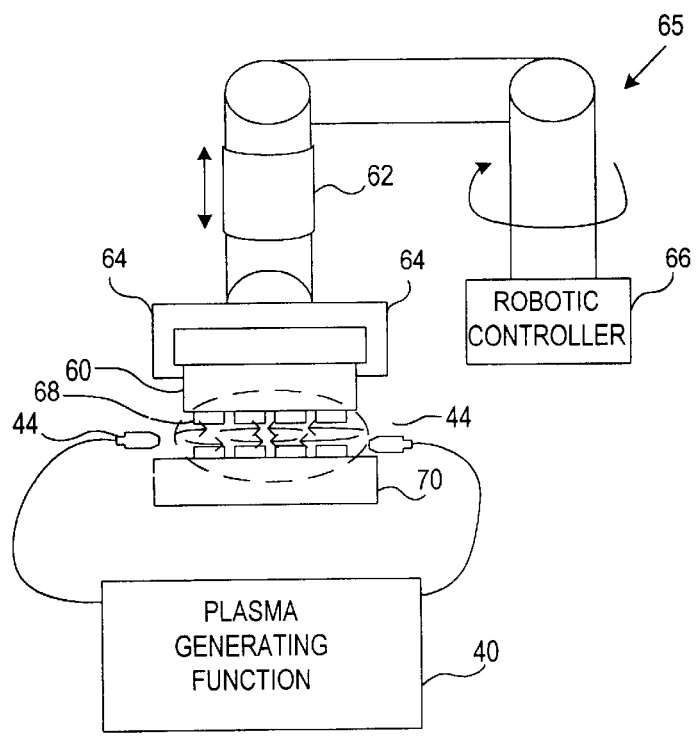
FIG. 7A is a block diagram of second embodiment of a plasma enhanced component attach bonder implemented in accordance with the invention.
Figure 7B:
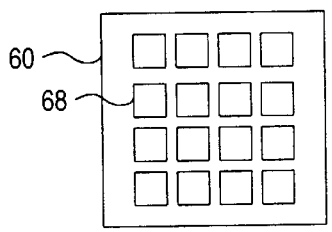
FIG. 7B is a pad layout pattern of an integrated circuit die or package.
Figure 7C:
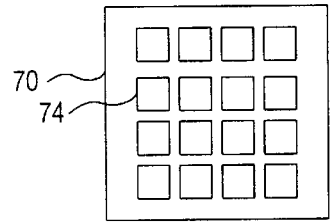
FIG. 7C is a pad layout pattern of a package or circuit board that matches that of the integrated circuit die/package of FIG. 7B to be attached.

FIG. 7A illustrates another embodiment of the present invention, wherein the circuit component comprises an integrated circuit die or package 60 with attachment sites comprising a ball grid array (BGA) 64 of die/package pads 68 of the integrated circuit die/package 60. FIG. 7B illustrates an example BGA layout pattern, with die/package pads 68 arranged in a square grid. FIG. 7C illustrates the corresponding circuit package/board 70 that the circuit die/package 60 is to be attached to. Of course, the invention extends to any pad layout pattern.

Referring back to FIG. 7A, circuit package/board 70 comprises a plurality of pads 74 matching the pattern and spacing of the die/package 60 pad pattern. In this embodiment, component contact function 20 comprises a robotic arm 65 controlled by a controller 66. Controller 66 controls grippers 64 to grip and hold die/package 60 and precisely position the die/package 60 in non-contacting alignment with the matching bond pad array on the circuit package/board 70. Modulated plasma 84 is aimed between the die/package pads 68 and the package/board pads 74 prior to and during the positioning of the die/package 60 against the package/board 70 by the robotic arm 65, forming a dynamic cleaning chamber bubble 90 around and between the die/package 60 and package/board 70. Controller 65 then controls the robotic arm 65 to compress the die/package pads 68 against the circuit package/board pads 74 with sufficient contact force to allow direct contact bonding. Where more robust bonds are desired, the robotic arm 65 is configured to provide sufficient contact pressure over sufficient time to allow diffusion bonding to occur between the die/package pads 68 and package/board pads 74.

Figure 7D:
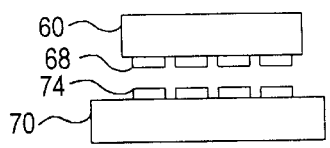
FIG. 7D is a side view of a ball grid array die/package and package/board.
Figure 7E:
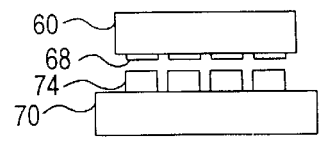
FIG. 7E is a side view of a second ball grid array die/package and package/board.
Figure 7F:
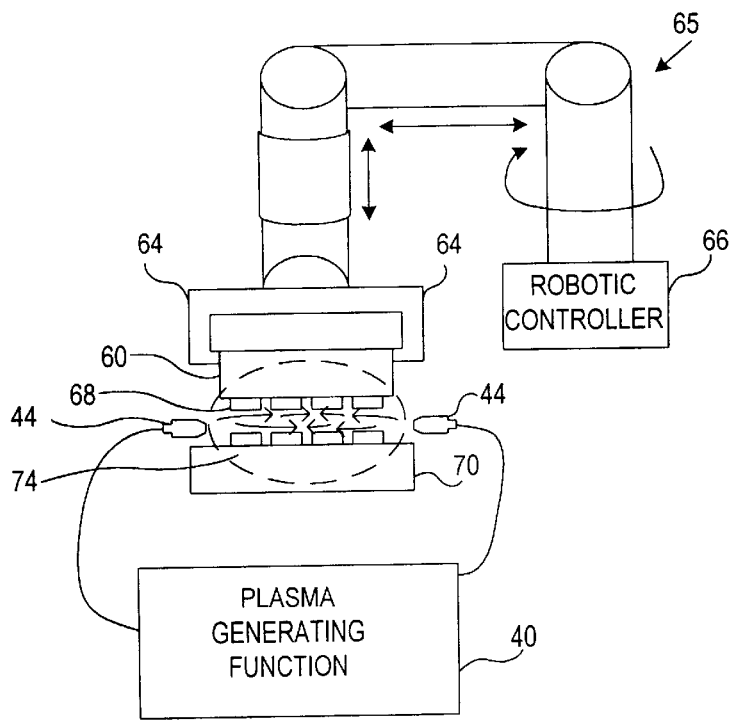
FIG. 7F is a block diagram of third embodiment of a plasma enhanced component attach bonder implemented in accordance with the invention.
Figure 7G:
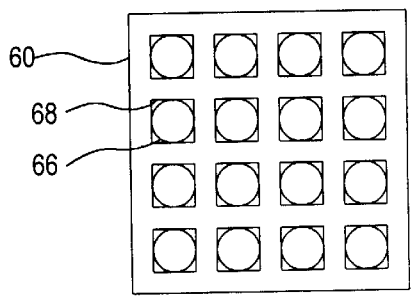
FIG. 7G is a pad layout pattern of an integrated circuit die or package for use in the third embodiment of FIG. 7F.

The embodiment of FIG. 7A eliminates any need for filler material such as solder. In this embodiment, one or the other of the die/package pads 68 (FIG. 7D) and/or the package/board pads 74 (FIG. 7E) protrude from the surface of their respective die/package 60 or package/board 70 to allow contact between the pads 68 and 74 when the components 60 and 70 are compressed together as previously described.

Figure 7I:
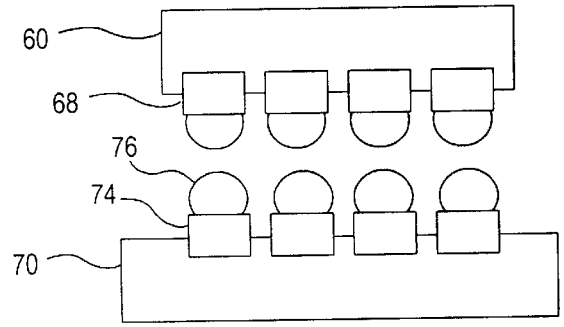
FIG. 7I is a side view of a second ball grid array die/package and package/board for use in the third embodiment of FIG. 7F.
Figure 7H:
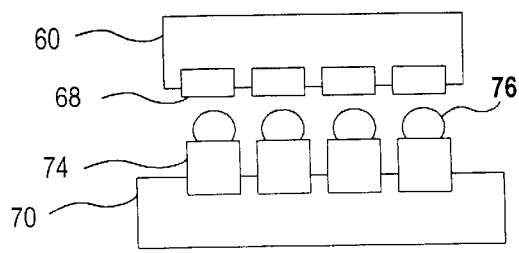
FIG. 7H is a side view of a ball grid array die/package and package/board for use in the third embodiment of FIG. 7F.

Although no filler material is required for bonding, some current packages are pre-fabricated with filler material already present on the component attachment sites. For example, ball grid arrays (BGAs) typically are manufactured with solder bumps 66 pre-attached to the die/package pads 68. The plasma may still be used in this embodiment to melt the solder bumps 66 while simultaneously cleaning the solder bumps 66 (to remove contaminants and flux) and package/board pads 74. FIGS. 7F–7I illustrate an alternative embodiment wherein the die/package 60 comprises solder bumps 66 pre-attached to the die/package pads 68 (FIGS. 7F, 7G, 7I), and/or the package/board 70 comprises solder bumps 76 pre-attached to the package/board pads 74 (FIGS. 7H, 7I). In this embodiment, the plasma flow is aimed between the package/board pads 74 and the die/package 60, and plasma flows therebetween before and during the contacting union of the solder bumps 66 and/or 76 with the pads 68 and/or 74, and if applicable, the opposing solder bumps 76 and/or 66. The heat of the plasma melts the solder, which instantly bonds to the pads 68/74 because the pads 68/74 are rendered contaminant-free by the plasma.

The present invention as described in detail above is advantageous over the prior art in several respects. First, the metal bonding surfaces of the component attachment site bond pad are cleaned as bonding occurs to eliminate any contaminants from being introduced into the final bond, thereby improving the integrity of the bond. Secondly, because the temperature of the bond surface heated by the plasma/hot gas as it hits the surfaces to be bonded is high enough, the device embodying the component contact function need not itself necessarily include a heater, thereby providing "localized" heating to reduce the risk of accidentally damaging any of the circuitry components on the board. In addition, because the plasma removes essentially all of the contaminants from the surfaces of the bonding sites, components may be attached to the bonding sites without the use of additional filler material such as solder or epoxy. Furthermore, for the same reason, materials that previously could not be bonded together or were extremely difficult to bond (e.g., Aluminum) due to the strength of their bonds with contaminants (e.g., Oxygen), can now be bonded with the present invention. Finally, even certain non-metallic materials may be bonded together using the present invention. For example, glass-to-glass or glass-to-metal bonds are now possible.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. A plasma enhanced component attachment bonder, comprising:
   a component contacting device which positions a component attachment site of a component into contact with a bond site; and
   a plasma generator which applies a pressurized directional flow of plasma at and between said component attachment site of said component and said bond site prior to and during said contact of said component attachment site of said component with said bond site.

2. A plasma enhanced component attachment bonder in accordance with claim 1, wherein:
   said bond site comprises a bond pad on a printed circuit board and said component attachment site comprises an attachment tab of an electrical component.

3. A plasma enhanced component attachment bonder in accordance with claim 1, wherein:

said bond site comprises a bond pad on a printed circuit board and said component attachment site comprises a wire lead of an electrical component.

4. A plasma enhanced component attachment bonder in accordance with claim 1, wherein:

said bond site comprises a bond pad on a printed circuit board and said component attachment site comprises a die pad of a ball grid array integrated circuit die.

5. A plasma enhanced component attachment bonder in accordance with claim 1, wherein:

said bond site comprises a bond pad on a printed circuit board and said component attachment site comprises a solder bump attached to a die pad of a ball grid array integrated circuit die.

6. A plasma enhanced component attachment bonder in accordance with claim 1, wherein:

said bond site comprises a bond pad on a printed circuit board and said component attachment site comprises a die pad of a ball grid array integrated circuit package.

7. A plasma enhanced component attachment bonder in accordance with claim 1, wherein:

said bond site comprises a bond pad on a printed circuit board and said component attachment site comprises a solder bump attached to a die pad of a ball grid array integrated circuit package.

8. A plasma enhanced component attachment bonder in accordance with claim 1, wherein:

said bond site comprises a first solder bump attached to a bond pad on a printed circuit board and said component attachment site comprises a second solder bump attached to a die pad of a ball grid array integrated circuit package.

\* \* \* \* \*